(12) United States Patent
Honboh

(10) Patent No.: US 7,009,267 B2
(45) Date of Patent: Mar. 7, 2006

(54) SEMICONDUCTOR DEVICE

(75) Inventor: Masahiro Honboh, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/929,893

(22) Filed: Aug. 31, 2004

(65) Prior Publication Data
US 2005/0045999 A1     Mar. 3, 2005

(30) Foreign Application Priority Data
Sep. 1, 2003     (JP)     ............................ P2003-308423

(51) Int. Cl.
H01L 27/14     (2006.01)
H01L 31/00     (2006.01)
H01L 31/0232     (2006.01)
H01L 31/0203     (2006.01)

(52) U.S. Cl. ...................... 257/433; 257/432; 257/431
(58) Field of Classification Search ................ 257/433
See application file for complete search history.

(56) References Cited

U.S. PATENT DOCUMENTS 3,560,813 A * 2/1971 Phy .............................. 257/680
4,309,717 A * 1/1982 Cardinal ....................... 257/680
4,439,006 A * 3/1984 Stevenson ..................... 385/88
4,706,106 A * 11/1987 Shiba et al. ................. 257/682
5,089,861 A * 2/1992 Tanaka et al. ................ 372/36
6,855,886 B1 * 2/2005 Kawamura et al. ........ 174/52.2

FOREIGN PATENT DOCUMENTS

JP     5-175522     * 7/1993     .................. 31/2
JP     5-315639     * 11/1993     .................. 31/12
JP     9-84162     3/1997

* cited by examiner

*Primary Examiner*—Nathan J. Flynn
*Assistant Examiner*—Victor A. Mandala, Jr
(74) *Attorney, Agent, or Firm*—Nixon & Vanderhye, P.C.

(57) ABSTRACT

A semiconductor device allows a second seal portion 8 made of a conductive resin to function as an electromagnetic wave shield for a photodetector 3 and a control IC chip 5 sealed with a first seal portion 7 made of a light-transmitting resin, when a third lead 1c for grounding of a lead frame 1 is connected to a ground terminal on a board. Conductive portions 21, 22 of the second seal portion 8 fill through holes 16, 17 provided for projecting portions 10, 11 of the lead frame 1 so as to be in close contact with peripheral surfaces 16A, 17A of the through holes 16, 17. The through holes 16, 17 have peripheral surfaces 16A, 17A of a rectangular-columnar shape. The semiconductor device is capable of obtaining a sufficient electromagnetic shielding effect, while it is small and low-cost, having a high degree of mounting freedom on a board.

9 Claims, 6 Drawing Sheets

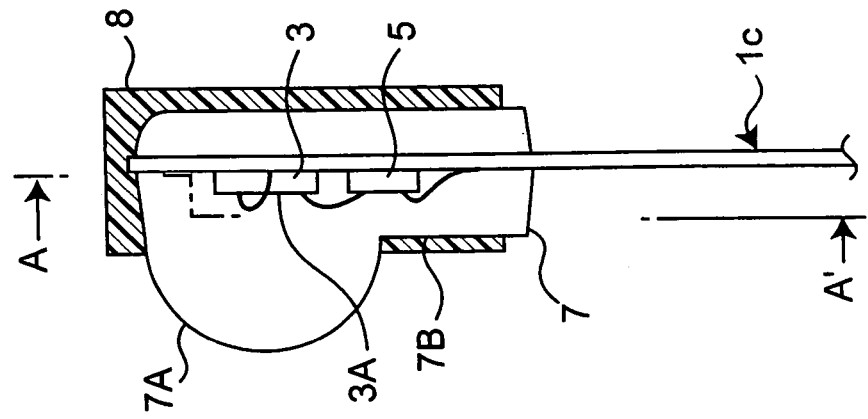
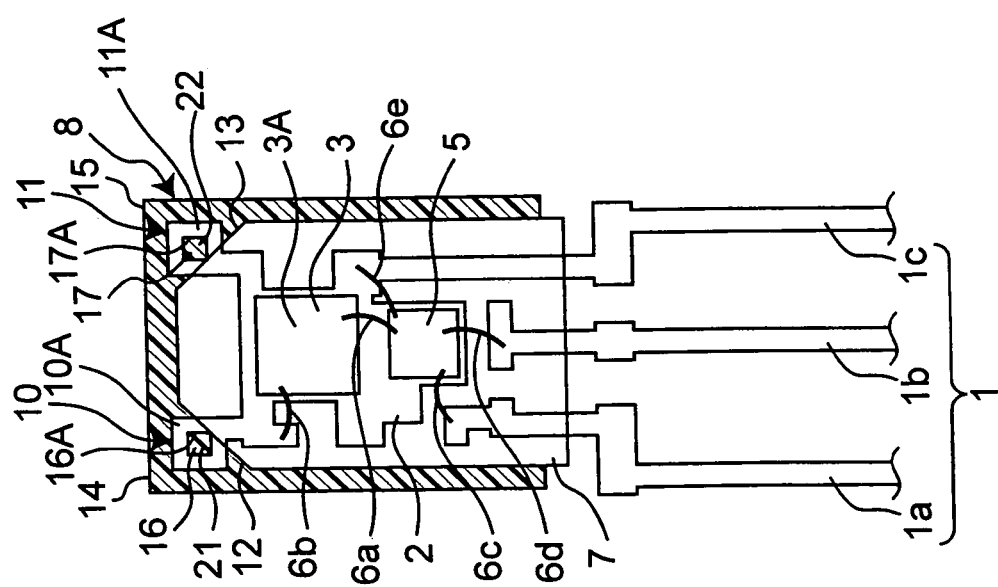

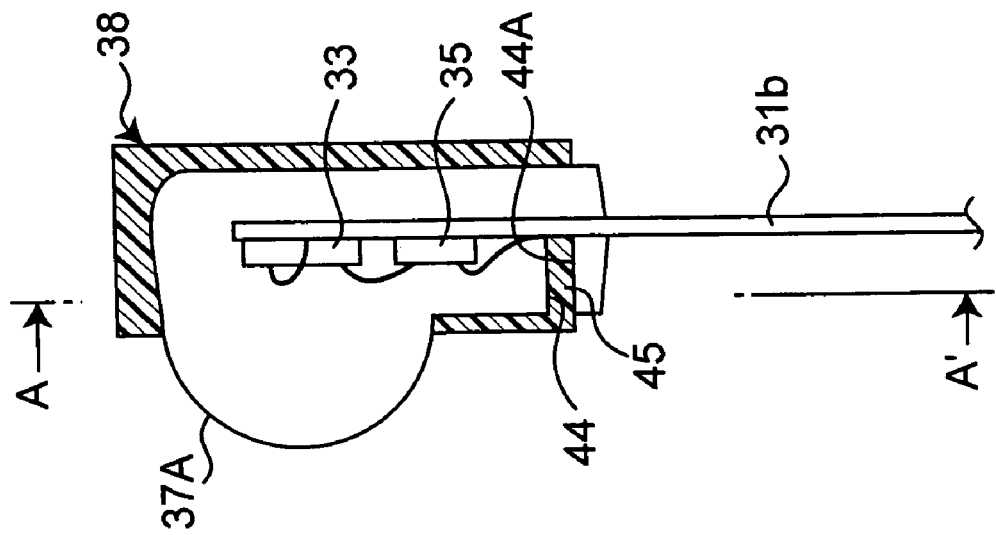
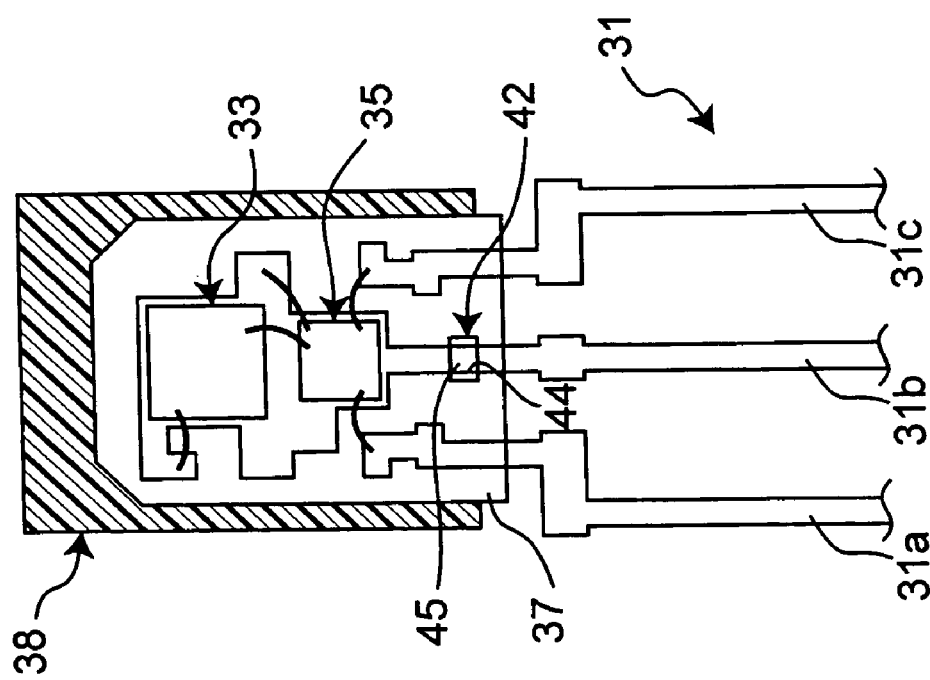

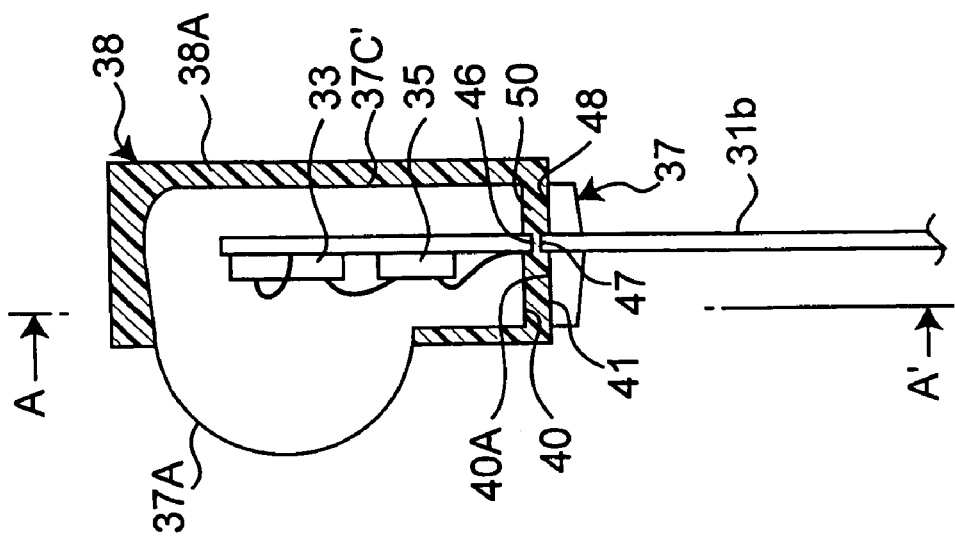
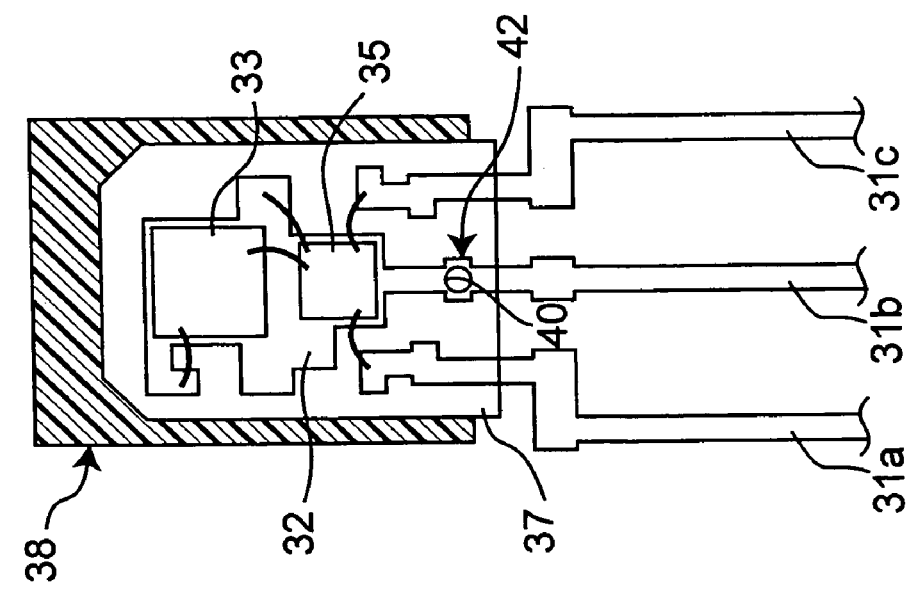

SEMICONDUCTOR DEVICE

This Nonprovisional application claims priority under 35 U.S.C. §119(a) on Patent Application No. P2003-308423 filed in Japan on Sep. 1, 2003, the entire contents of which are hereby incorporated by reference.

BACKGROUND OF THE INVENTION

The present invention relates to semiconductor devices provided with a photodetector and a signal processing section, more particularly to a semiconductor device for optical communication which receives an infrared signal from a transmitter and outputs a control signal for controlling operation of each electronic device, on which the semiconductor device is mounted, such as a television receiver, a video tape recorder, an audio component unit and an air conditioner.

Conventionally, a semiconductor device for optical communication has been provided with a light-receiving chip and a control IC chip on a board, some of these chips being sealed with an infrared-transparent resin.

This semiconductor device for optical communication receives a control signal for various electronic devices transmitted from a transmitter using infrared rays. This signal transmitted using infrared rays is so weak that the semiconductor device for optical communication incorporates a high-gain amplifier, which amplifies the optical signal using infrared rays, and converts the optical signal into a digital signal and outputs this signal. Accordingly, the semiconductor device for optical communication is very sensitive to noise.

As a measure against noise, the infrared transmitting resin is covered with a shield casing made of a metal. When a user mounts the semiconductor device for optical communication on a board, an end portion of the shield casing is electrically connected to a GND terminal of the board, with the result that noise is eliminated.

However, the following problems (a)–(c) have been found:
(a) There is an increase in the number of processes required for covering the device with the shield casing.
(b) There is a cost for the shield casing itself.
(c) There is a restriction on the mounting freedom of the semiconductor device on the board, which is dependent on the design of the shield casing.

Consequently, it has been suggested that areas other than a light-receiving area of the infrared transmitting resin are covered with a conductive resin instead of the shield casing, and a lead frame protruding from the end portion of the infrared transmitting resin is electrically connected to the conductive resin (see, e.g., JP H09-84162 A).

In the conventional example, however, the electrical contact between the lead frame and the conductive resin tends to be insufficient, and consequently the shielding effect also tends to be insufficient, disadvantageously.

SUMMARY OF THE INVENTION

Accordingly, an object of the present invention is to provide a semiconductor device which is capable of obtaining a sufficient electromagnetic shielding effect, which is small and low-cost, and which has a high degree of mounting freedom on a board.

In order to achieve the above object, there is provided a semiconductor device comprising: a lead frame; a photodetector mounted on the lead frame; a signal processing section mounted on the lead frame and electrically connected to the photodetector; a first seal portion made of a light-transmitting resin for sealing the photodetector and the signal processing section; and a second seal portion made of a conductive resin for covering the first seal portion, wherein the second seal portion has a conductive portion which makes contact with lead for grounding provided for the lead frame, and at least one of the lead for grounding and the first seal portion has a fill hole which is filled with the conductive portion of the second seal portion.

According to the present invention, a first seal portion made of a light-transmitting resin is covered with a second seal portion made of a conductive resin, so that the second seal portion functions as an electromagnetic wave shield for a photodetector and a signal processing section sealed with the first seal portion. A conductive portion of the second seal portion fills a fill hole which is provided for at least one of the lead wiring for grounding and the first seal portion, thereby the second seal portion is electrically connected to the lead wiring for grounding.

As a result, sufficiently effective electromagnetic wave shielding is provided by the second seal portion. A shield casing made of a metal is not required, with the result that the semiconductor device of the present invention is both small and low-cost, and has a greater degree of mounting freedom on a board. When a fill hole is formed in the lead wiring for grounding and this hole is filled with the conductive portion, the conductivity of the electrical connection between the second seal portion and the lead wiring for grounding is improved, and the mechanical connection between the second seal portion and the lead wiring for grounding is strengthened.

By way of an example, when a photodetector receives infrared rays as signal light, an infrared transmitting resin is employed instead of the light-transmitting resin.

In one embodiment of the present invention, the lead for grounding has a projecting portion which protrudes from the first seal portion into the second seal portion, and the projecting portion has the fill hole of which an inner peripheral surface is a polygonal-columnar shape.

In the present embodiment, a projecting portion of the lead wiring for grounding protrudes into the second seal portion, so that the projecting portion is electrically connected to the second seal portion. A conductive portion of the second seal portion fills the fill hole in the projecting portion, so that the conductivity of the electrical connection and the mechanical strength of coupling between the projecting portion and the second seal portion are improved. Since the fill hole has an inner peripheral surface being a polygonal prism in shape, as compared with the case in which its inner peripheral surface is cylindrical, the contact area between the inner peripheral surface of the hole and the conductive portion of the second seal portion is increased, with the result that the conductivity of the electrical connection and the mechanical strength of coupling are further improved. Therefore, effective electromagnetic wave shielding by the second seal portion is surely obtained.

In one embodiment of the present invention, the first seal portion has the fill hole of which an inner peripheral surface is a cylindrical shape.

In the present embodiment, the conductive portion of the second seal portion is electrically connected to the lead wiring for grounding by filling the fill hole provided in the first seal portion with the conductive portion of the second seal portion with making contact therebetween. Therefore, the lead wiring for grounding is not required to protrude from the first seal portion into the second seal portion, so that miniaturization of the semiconductor device is achieved. Since the fill hole of the first seal portion has a cylindrical inner peripheral surface, increase in a contour dimension of the fill hole is suppressed and a sufficient volume for the first seal portion is ensured, the semiconductor device is further miniaturized.

In one embodiment of the present invention, the lead for grounding has a through hole which is filled with an extended portion extending from the conductive portion of the second seal portion.

In the present embodiment, the lead wiring for grounding is provided with a through hole which is filled with an extended portion of the conductive portion in the second seal portion in addition to the first seal portion being provided with the fill hole. Since the inner peripheral surface of the through hole in the lead wiring for grounding makes contact with the extended portion of the conductive portion in the second seal portion, the contact area between the lead wiring for grounding and the second seal portion is increased, with the result that the conductivity of the electrical connection between the lead wiring for grounding and the second seal portion is further improved.

In one embodiment of the present invention, the first seal portion has the fill hole of which an inner peripheral surface is a polygonal-columnar shape.

In the present embodiment, the inner peripheral surface of the fill hole in the first seal portion is polygonal-columnar. Consequently, the mechanical strength of coupling between the inner peripheral surface of the fill hole and the conductive portion of the second seal portion filling the inner peripheral surface is improved. Additionally, the reliability of the electrical connection and conductivity are improved, by way of increasing the contact area between the conductive portion and the lead wiring for grounding.

In one embodiment of the present invention, the lead for grounding is provided with a notch on a contact area with the second seal portion.

In the present embodiment, the lead for grounding is provided with the notch on the contact area, thus the contact area between the lead wiring for grounding and the second seal portion is increased, with the result that the electrical and mechanical connections between the lead wiring for grounding and the second seal portion are improved.

In one embodiment of the present invention, the lead for grounding is satin-finished on a contact area with the second seal portion.

In the present embodiment, the lead for grounding is satin-finished on the contact area with the second seal portion, thus the contact area between the lead wiring for grounding and the second seal portion is increased, with the result that the electrical and mechanical connections between the lead wiring for grounding and the second seal portion are improved. Therefore, effective electromagnetic wave shielding by the second seal portion is surely obtained.

Also, there is provided a method for manufacturing the above semiconductor device, comprising the steps of:

a first molding process for making the first seal portion by molding with a resin; and a second molding process for making the second seal portion by molding with a resin, wherein the fill hole of the first seal portion is formed using an eject pin in the first molding process; and a conductive resin to be the conductive portion is injected into the fill hole in the first seal portion in the second molding process.

In the above manufacturing method, a mold for the first seal portion is ejected and a fill hole is formed using an eject pin simultaneously in the first molding process, with the result that the production process is simplified.

Also, there is provided an electronic device comprising the above semiconductor device.

The above electronic device comprises the semiconductor device. Thus the electronic device fulfills sufficiently effective electromagnetic wave shielding against noise and small-sized and low-cost products.

According to the present invention, the conductive portion of the second seal portion fills the fill hole provided for at least one of a lead wiring for grounding of the lead frame and the first seal portion, thereby the second seal portion is electrically connected to the lead wiring for grounding of the lead frame. As a result, sufficiently effective electromagnetic wave shielding is provided by the second seal portion, as well as small-sized and low-cost products having a greater degree of mounting freedom on a board are obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A is a view schematically showing a cross section of a first embodiment of a semiconductor device for optical communication according to the present invention, and FIG. 1B is a view schematically showing another cross section of the first embodiment;

FIG. 5A is a sectional view schematically showing the third embodiment and FIG. 5B is a view schematically showing another cross section of the third embodiment;

FIG. 6A is a sectional view schematically showing a fourth embodiment and FIG. 6B is a view schematically showing another cross section of the fourth embodiment.

DETAILED DESCRIPTION OF THE PREFERRED EMBODIMENTS

Figure 2A:
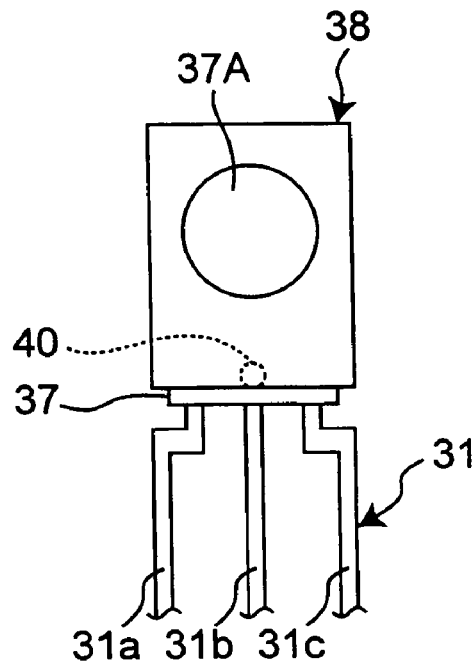
FIG. 2A is a front view and FIG. 2B is a side view of a second embodiment of the present invention.

This invention will be described in further detail by way of preferred embodiments with reference to the accompanying drawings.

(First Embodiment)

FIG. 1A and FIG. 1B show the semiconductor device for optical communication as the first embodiment of the invention. FIG. 1A is a cross sectional view taken along line A–A' of FIG. 1B.

The semiconductor device of the first embodiment is provided with a lead frame 1, which is composed of a first lead 1a for signal, a second lead 1b for power source and a third lead 1c for grounding. The semiconductor device is also provided with a light-receiving chip 3, which is a photodetector mounted on a mount portion 2 of the third lead 1c for grounding, and a control IC chip 5 which is a signal processing section. The light-receiving chip 3 is implemented by a photodiode or a phototransistor or the like. The control IC chip 5 incorporates a high-gain amplifier.

The control IC chip 5 is connected to the light-receiving chip 3 by a conductive wire 6a, and the light-receiving chip 3 is connected to the third lead 1c by a conductive wire 6b. In addition, the control IC chip 5 is connected to the first lead 1a by a conductive wire 6c, to the second lead 1b by a conductive wire 6d, and to the third lead 1c by a conductive wire 6e.

The lead frame 1, the light-receiving chip 3 and the control IC chip 5 are integrally fixed by a first seal portion 7 made of an infrared transmitting resin as a light-transmitting resin, and the first seal portion 7 seals the light-receiving chip 3 and the control IC chip 5. The first seal portion 7 is provided with a projected curved surface 7A for introducing an infrared ray as signal light to a light-receiving surface 3A of the light-receiving chip 3. A surface 7B, which is a part other than the projected curved surface 7A within the first seal portion 7, is covered and sealed with a second seal portion 8 made of a conductive resin. In FIG. 1, only the second seal portion 8 is cross hatched.

The lead frame 1 is provided with projecting portions 10 and 11, which are generally rectangular in shape and protrude from the first seal portion 7 into the second seal portion 8. That is, the projecting portions 10 and 11 are buried in the second seal portion 8. The projecting portions 10 and 11 are arranged between chamfered portions 12 and 13 of the first seal portion 7 and corner portions 14 and 15 of the second seal portion 8. This arrangement suppresses increase in contour dimensions of the semiconductor device caused by the presence of the projecting portions 10 and 11, so that miniaturization of the device is achieved.

In addition, the projecting portions 10 and 11 contain through holes 16 and 17, of which the peripheral surfaces 16A and 17A are generally rectangular-columnar shaped. The through holes 16 and 17 function as fill holes. The through holes 16 and 17 are filled with conductive portions 21 and 22 of the second seal portion 8, and the conductive portions 21 and 22 are in close contact with the peripheral surfaces 16A and 17A of the through holes 16 and 17. In the first embodiment, not only the peripheral surfaces 16A and 17A of the holes 16 and 17 in the projecting portions 10 and 11, but also entire surfaces 10A and 11A on the projecting portions 10 and 11 are in close contact with the second seal portion 8.

According to the construction of the semiconductor device for optical communication as described above, when signal light composed of infrared rays is made incident on the projected curved surface 7A of the first seal portion 7, the signal light is introduced to the light-receiving surface 3A on the light-receiving chip 3. Then the light-receiving chip 3 converts the signal light into an electrical signal, and outputs the electrical signal to the control IC chip 5 through the conductive wire 6a. The control IC chip 5 performs a prescribed signal processing on the electrical signal, and outputs the processed signal to the first lead 1a through the conductive wire 6c. The control IC chip 5 is also connected to the second lead 1b by a conductive wire 6d. The second lead 1b is connected to a power source on a board (not shown), and power is supplied to the control IC chip 5 from the power source through the second lead 1b and the conductive wire 6d. The control IC chip 5 is also connected to the third lead 1c by a conductive wire 6e. This third lead 1c is connected to a GND (ground) terminal on the board.

In the first embodiment, the second seal portion 8, which covers the first seal portion 7 made of an infrared transmitting resin, is made of a conductive resin. The second seal portion 8 is closely and electrically connected to the entire surfaces 10A and 11B on the projecting portions 10 and 11 of third lead 1c of the lead frame 1. Therefore, mounting the semiconductor device for optical communication on the board and connecting the third lead 1c to the ground terminal, allows the second seal portion 8 to function as an electromagnetic wave shield for the photodetector 3 and the control IC chip 5 sealed with the first seal portion 7. The conductive portions 21 and 22 of the second seal portion 8 fill the through holes 16 and 17 provided in the projecting portions 10 and 11 of the lead frame 1. The conductive portions 21 and 22 are in close contact with the peripheral surfaces 16A and 17A of the through holes 16 and 17. As a result, contact areas between the projecting portions 10 and 11 and the second seal portion 8 are increased, and both conductivity of the electrical connection between the projecting portions 10 and 11 and the second seal portion 8 and the effect of electromagnetic wave shielding are improved. Additionally, the mechanical coupling between the projecting portions 10 and 11 and the second seal portion 8 are strengthened.

Since the peripheral surfaces 16A and 17A have a rectangular-columnar form, as compared with the case of a cylindrical form, the contact areas are increased, and the conductivity of the electrical connections between the projecting portions 10 and 11 and the second seal portion 8 are improved, and the mechanical coupling between the projecting portions 10 and 11 and the second seal portion 8 are further strengthened.

In the first embodiment, a notch may be formed on the surfaces of the projecting portions 10 and 11, which are contact areas of the third lead 1c of the lead frame 1 with the second seal portion 8. The surfaces of the projecting portions 10 and 11 may also be satin-finished. In these cases, the contact areas between the projecting portions 10 and 11 and the second seal portion 8 are increased, and the conductivity of the electrical connection between the second seal portion 8 and the third lead 1c is further improved. In the first embodiment, the first seal portion 7 may be provided with a fill hole extending to the third lead 1c, the fill hole may be filled with a conductive portion extending from the second seal portion 8, then the second seal portion 8 is electrically connected to the third lead 1c by the conductive portion. Also in this case, the conductivity of the electrical connection between the second seal portion 8 and the third lead 1c is further improved. Although the first embodiment relates to the case in which the light-receiving chip 3 receives infrared rays as signal light, signal light other than infrared rays may be received. In this case, the first seal portion 7 may be made of a resin having such properties as to permit transmission of the signal light.

(Second Embodiment)

Figure 2B:
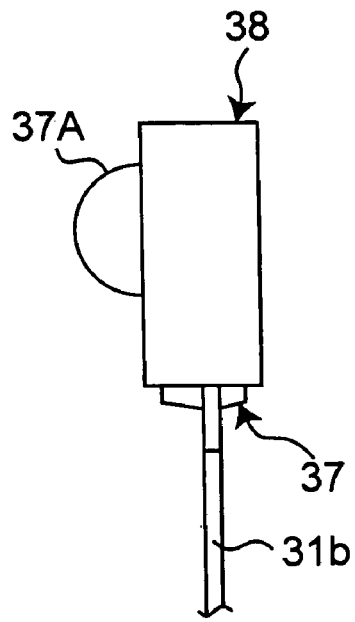
Figure 3B:
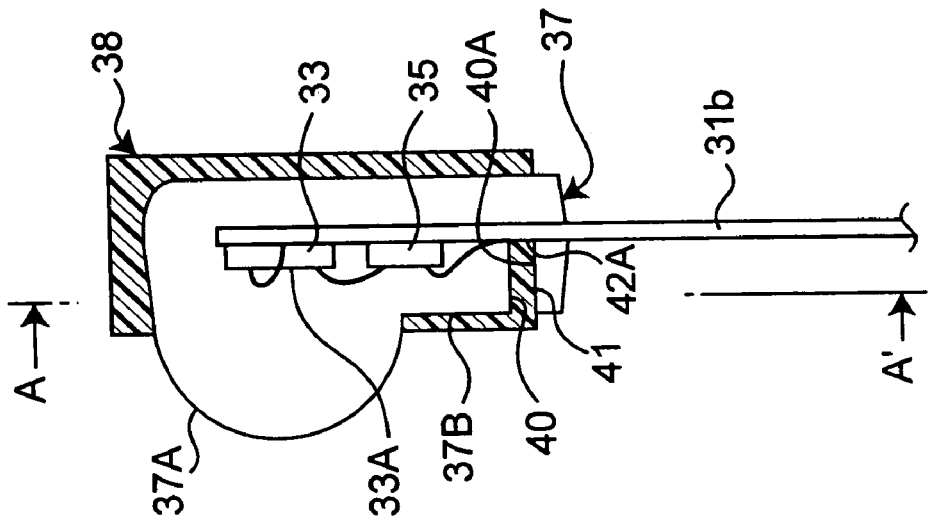
FIG. 3A is a sectional view schematically showing the second embodiment and FIG. 3B is a view schematically showing another cross section of the second embodiment.
Figure 3A:
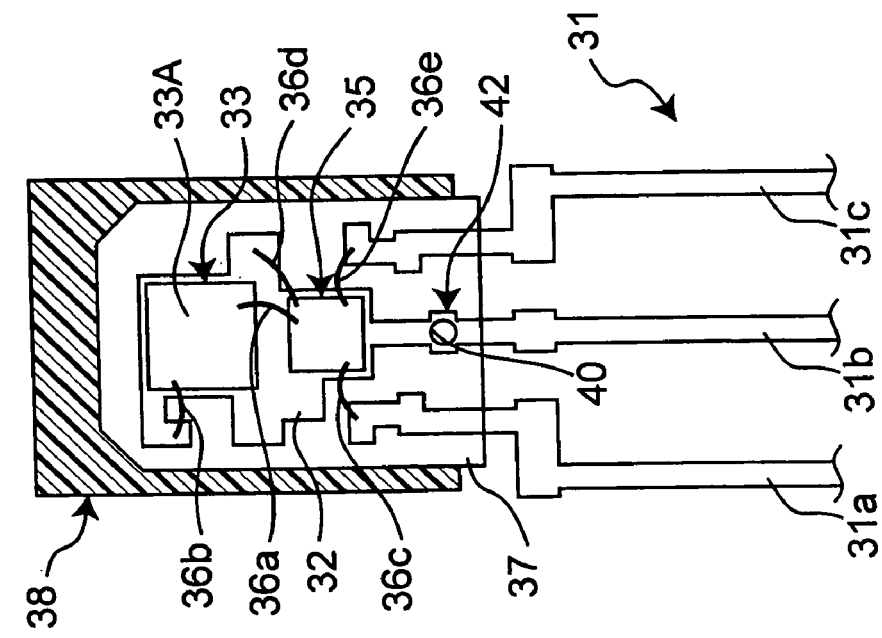

FIG. 2 and FIG. 3 show a second embodiment of the semiconductor device for optical communication according to the present invention. FIG. 2A shows an external front view and FIG. 2B shows a side view of the second embodiment of the present invention. FIG. 3A is a cross-sectional view taken along line A–A' of FIG. 3B.

The semiconductor device according to the second embodiment is provided with a lead frame 31, which is composed of first lead 31a for signal, second lead 31b for grounding, and third lead 31c for power source. The semiconductor device is also provided with a light-receiving chip 33 which is a photodetector mounted on a mount portion 32 of the second lead 31b for grounding, and a control IC chip 35 which is a signal processing section. The control IC chip 35 is connected to the light-receiving chip 33 by a conductive wire 36a, and the light-receiving chip 33 is connected to the second lead 31b by a conductive wire 36b. In addition, the control IC chip 35 is connected to the first lead 31a by a conductive wire 36c, to the second lead 31b by a conductive wire 36d, and to the third lead 31c by a conductive wire 36e.

The lead frame 31, the light-receiving chip 33 and the control IC chip 35 are integrally fixed by the first seal portion 37 made of an infrared transmitting resin, and the first seal portion 37' seals the light-receiving chip 33 and the control IC chip 35. The first seal portion 37 is provided with a projected curved surface 37A for introducing infrared rays as a signal light to a light-receiving surface 33A on the light-receiving chip 33. A surface 37B, which is a part other than the projected curved surface 37A within the first seal portion 37, is covered and sealed with a second seal portion 38 made of a conductive resin.

In the second embodiment, the first seal portion 37 is provided with a fill hole 40 extending from its surface 37B to a rectangular portion 42 of the second lead 31b. The fill hole 40 has an inner peripheral surface 40A which is a cylinder in shape. The second seal portion 38 is provided with a conductive portion 41 which fills the fill hole 40. The conductive portion 41 makes contact with and is electrically connected to the rectangular portion 42 of the second lead 31b. In FIG. 3, only the second seal portion 38 is cross hatched.

Basic functions of the second embodiment are similar to those of the first embodiment, and hence their detailed description is omitted here. According to the second embodiment, a second seal portion 38, which covers a first seal portion 37 made of an infrared transmitting resin, is made of a conductive resin. The second seal portion 38 is electrically connected to second lead 31b for grounding by a conductive portion 41. Therefore, mounting the semiconductor device according to the second embodiment on a board (not shown) allows the second seal portion 38 to function as an electromagnetic wave shield for a light-receiving chip 33 and a control IC chip 35 sealed with the first seal portion 37. The conductive portion 41 of the second seal portion 38 fills a fill hole 40 provided for the first seal portion 37, thereby the second seal portion 38 is electrically connected to the second lead 31b for grounding of the lead frame 31. As a result, sufficiently effective electromagnetic wave shielding is obtained by the second seal portion 38, as well as the semiconductor device of the present invention is both small and low-cost, and has a greater degree of mounting freedom on a board.

According to the second embodiment, the second lead 31b of the lead frame 31 is not required to protrude from the first seal portion 37 into the second seal portion 38, so that miniaturization of the device is achieved. Since an inner peripheral surface 40A of the fill hole 40 in the first seal portion 37 is cylindrical, increase in a contour dimension of the fill hole 40 is suppressed and a sufficient volume for the conductive portion 41 is ensured. Thus the device is further miniaturized.

In the second embodiment, a notch may be formed on a contact portion 42A of the rectangular portion 42 in the second lead 31b of the lead frame 31 with the conductive portion 41. The rectangular portion 42 may be satin-finished. In these cases, the contact area between the conductive portion 41 and the second lead 31b is increased, and the conductivity of the electrical connection between the conductive portion 41 and the second lead 31b is improved.

According to the second embodiment, a method of manufacturing the semiconductor device is composed of a first molding process for making the first seal portion 37 by molding with a resin and a second molding process for making the second seal portion 38 by molding with a resin. The fill hole 40 may be formed in the first seal portion 37 using eject pin in the first molding process and the conductive resin for the conductive portion 41 may be injected into the fill hole 40 of the first seal portion 37 in the second molding process. In this case, the ejection of mold for the first seal portion 37 and the formation of the fill hole 40 with an eject pin can be performed simultaneously in the first molding process, with the result that the production process of the semiconductor device is simplified. Although the second embodiment relates to the case in which the light-receiving chip 33 receives infrared rays as a signal light, a signal light other than infrared rays may be received. In this case, the first seal portion 37 may be made of a resin having such properties as to permit transmission of the signal light.

(Third Embodiment)

Figure 4A:
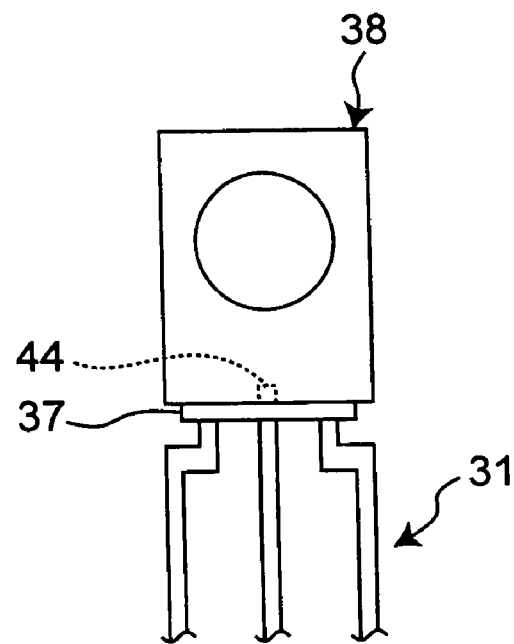
FIG. 4A is a front view and FIG. 4B is a side view of a third embodiment of the present invention.
Figure 4B:
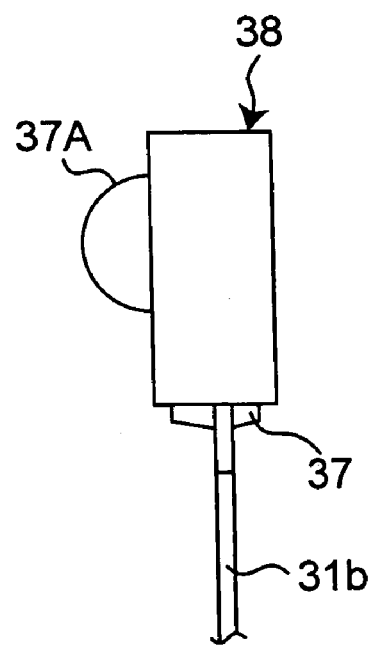

FIG. 4 and FIG. 5 show a third embodiment of the semiconductor device for optical communication according to the present invention. FIG. 4A shows an external front view and FIG. 4B shows a sectional view of the third embodiment of the present invention. FIG. 5A is a cross-sectional view taken along line A–A' of FIG. 5B. The semiconductor device of the third embodiment has the same structure as the semiconductor device of the second embodiment except the following point (i).

(i) The first seal portion 37 is provided with a fill hole 44 of which peripheral surface 44A is of a rectangular-columnar shape, instead of a fill hole 40 of which inner peripheral surface is cylindrical, and the fill hole 44 is filled with a rectangular-columnar conductive portion 45 of the second seal portion 38.

In the third embodiment, the fill hole 44 provided for the first seal portion 37 is of a rectangular-columnar shape, so that the mechanical strength of coupling between the inner peripheral surface 44A of the fill hole 44 and the conductive portion 45 of the second seal portion 38 filling the inner peripheral surface 44A is improved. Additionally, the reliability and conductivity of the electrical connection are improved, by way of increasing the contact area between the conductive portion 45 and the second lead 31b of the lead frame 31.

(Fourth Embodiment)

FIG. 6 shows a fourth embodiment of the semiconductor device for optical communication according to the present invention. FIG. 6A is a cross-sectional view taken along line A–A' of FIG. 6B. The semiconductor device of the fourth embodiment has the same structure as the semiconductor device of the second embodiment except the following points (i) and (ii).

(i) The rectangular portion 42 of the second lead 31b is provided with a through hole 46 which is filled with an extended portion 47 extending from the conductive portion 41 of the second seal portion 38. The through hole 46 has a smaller hole diameter than that of the fill hole 40 of the first seal portion 37.

(ii) The first seal portion 37 is provided with another fill hole 48 which extends from the opposite side of the fill hole 40 to the rectangular portion 42. The fill hole 48 extends from a back surface 37C opposite to the projected curved surface 37A to the rectangular portion 42. The fill hole 48 is filled with a conductive portion 50 extending from a back portion 38A of the second seal portion 38 covering the back surface 37C of the first seal portion 37. Therefore, the extended portion 47 belongs also to the conductive portion 50.

According to the fourth embodiment, second lead 31b for grounding is provided with a through hole 46 filled with an extended portion 47 extending from the conductive portion 41 of the second seal portion 38, as well as the first seal portion 37 is provided with the fill hole 40. Since an inner peripheral face of the through hole 46 in the second lead 31b makes contact with the extended portion 47 of the conductive portion 41, the contact area between the second lead 31b for grounding and the second seal portion 38 is increased, with the result that the conductivity of the electrical connection between the second lead 31b and the second seal portion 38 is further improved. Additionally, since the extended portion 47 in the second lead 31b is engaged with the through hole 46 of the second seal portion 38, the mechanical strength of coupling between the second lead 31b and the second seal portion 38 is strengthened, as well as the reliability of the electrical connection between the second lead 31b and the second seal portion 38 is improved. Although the fourth embodiment relates to the case in which the through hole 46 has an inner peripheral surface of a cylindrical shape, the inner peripheral surface may be a polygonal-columnar shape including a rectangular-columnar shape.

In the fourth embodiment, the fill hole 48 extending from back surface 37C of the first seal portion 37 to the rectangular portion 42 is filled with the conductive portion 50 extending from a back portion 38A of the second seal portion 38. As a result, further effective electromagnetic wave shielding is provided by the electrical connection by means of the contact between the conductive portion 50 and the rectangular portion 42, with the result that the conductivity of the electrical connection between the second seal portion 38 and the second lead 31b is further improved.

In the third and fourth embodiments, when the third lead 31b for grounding is provided with a projecting portion protruding from the first seal portion 37 into the second seal portion 38, the conductivity of the electrical connection between the second seal portion 38 and the third lead 31b is further improved. The projecting portion may be provided with a through hole similar to the holes provided for the projecting portions 10 and 11 in the first embodiment. In this case, the conductive portion of the second seal portion 38 fills the through hole, so that the conductivity of the electrical connection is further improved. Electronic devices provided with the semiconductor device for optical communication as described in one of the first to fourth embodiments improve the S/N ratio of an infrared signal to be received, being hardly affected by noise. Examples of the electronic devices include a television receiver, a video tape recorder, an audio component unit and an air conditioner, which are operated by remote control using infrared rays as signal light.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising: a lead frame; a photodetector mounted on the lead frame; a signal processing section mounted on the lead frame and electrically connected to the photodetector; a first seal portion made of a light-transmitting resin for sealing the photodetector and the signal processing section; and a second seal portion made of a conductive resin for covering the first seal portion, wherein
the second seal portion has a conductive portion which makes contact with lead for grounding provided for the lead frame, and
at least one of the lead for grounding and the first seal portion has a fill hole which is filled with the conductive portion of the second seal portion.

2. The semiconductor device as set forth in claim 1, wherein
the lead for grounding has a projecting portion which protrudes from the first seal portion into the second seal portion, and
the projecting portion has the fill hole of which an inner peripheral surface is a polygonal-columnar shape.

3. The semiconductor device as set forth in claim 1, wherein
the first seal portion has the fill hole of which an inner peripheral surface is a cylindrical shape.

4. The semiconductor device as set forth in claim 3, wherein
the lead for grounding has a through hole which is filled with an extended portion extending from the conductive portion of the second seal portion.

5. The semiconductor device as set forth in claim 1, wherein
the first seal portion has the fill hole of which an inner peripheral surface is a polygonal-columnar shape.

6. The semiconductor device as set forth in claim 1, wherein
the lead for grounding is provided with a notch on a contact area with the second seal portion.

7. The semiconductor device as set forth in claim 1, wherein
the lead for grounding is satin-finished on a contact area with the second seal portion.

8. A method for manufacturing the semiconductor device as set forth in claim 1, comprising the steps of:
a first molding process for making the first seal portion by molding with a resin; and a second molding process for making the second seal portion by molding with a resin, wherein
the fill hole of the first seal portion is formed using an eject pin in the first molding process; and
a conductive resin to be the conductive portion is injected into the fill hole in the first seal portion in the second molding process.

9. An electronic device comprising the semiconductor device as set forth in claim 1.

* * * * *